United States Patent
Lautzenhiser et al.

(10) Patent No.: US 9,142,752 B2
(45) Date of Patent: Sep. 22, 2015

(54) LOW FREQUENCY BROAD BAND ULTRASONIC TRANSDUCERS

(71) Applicants: Frans Lautzenhiser, Zionsville, IN (US); Eric Molz, Houston, TX (US); Mahesh Matam, Zionsville, IN (US)

(72) Inventors: Frans Lautzenhiser, Zionsville, IN (US); Eric Molz, Houston, TX (US); Mahesh Matam, Zionsville, IN (US)

(73) Assignee: Piezotech LLC, Indianapolis, IN (US)

( * ) Notice: Subject to any disclaimer, the term of this patent is extended or adjusted under 35 U.S.C. 154(b) by 238 days.

(21) Appl. No.: 13/873,907

(22) Filed: Apr. 30, 2013

(65) Prior Publication Data

US 2013/0342077 A1    Dec. 26, 2013

Related U.S. Application Data

(60) Provisional application No. 61/641,004, filed on May 1, 2012, provisional application No. 61/673,823, filed on Jul. 20, 2012.

(51) Int. Cl.

| H01L 41/08 | (2006.01) |
|---|---|
| H01L 41/053 | (2006.01) |
| H01L 41/04 | (2006.01) |
| B06B 1/06 | (2006.01) |
| E21B 47/00 | (2012.01) |
| G10K 11/00 | (2006.01) |
| G01S 7/521 | (2006.01) |

(52) U.S. Cl.
CPC ............ *H01L 41/053* (2013.01); *B06B 1/0685* (2013.01); *E21B 47/0005* (2013.01); *G01S 7/521* (2013.01); *G10K 11/002* (2013.01); *H01L 41/04* (2013.01)

(58) Field of Classification Search
CPC ........................................................ H04R 17/00
USPC ........................... 310/326–328, 334, 358, 366
See application file for complete search history.

(56) References Cited

U.S. PATENT DOCUMENTS

| 4,371,805 A * | 2/1983 | Diepers et al. ................. 310/334 |
|---|---|---|
| 4,564,980 A * | 1/1986 | Diepers ......................... 29/25.35 |
| 4,963,782 A * | 10/1990 | Bui et al. ....................... 310/358 |
| 5,625,149 A * | 4/1997 | Gururaja et al. ................ 73/632 |
| 7,459,836 B2 * | 12/2008 | Scott ............................. 310/334 |
| 2002/0108220 A1* | 8/2002 | Hanafy ......................... 29/25.35 |
| 2005/0001517 A1* | 1/2005 | Yogeswaren ................. 310/334 |

* cited by examiner

*Primary Examiner* — Thomas Dougherty
(74) *Attorney, Agent, or Firm* — Overhauser Law Offices LLC (57) ABSTRACT

Low frequency pulse-echo ultrasonic transducers are provided especially suited for use in downhole cement bond evaluation, but usable for various applications. One frequency pulse-echo ultrasonic transducer comprises a transducer stack having alternating layers of a piezoceramic element and an ultrasonic attenuating element that is preferably acoustic impedance matched to the piezoceramic elements in order to reduce the Q of the transducer stack. Another low frequency pulse-echo ultrasonic transducer comprises an assembly having the present transducer stack disposed on an acoustic attenuating backing and a front face. Yet another low frequency pulse-echo ultrasonic transducer comprises a transducer composite made from a lead metaniobate. Still another frequency pulse-echo ultrasonic transducer comprises a composite stack. A further low frequency pulse-echo ultrasonic transducer comprises a composite stack, wherein multiple drive elements allow driving individual elements at different times. The transducers may be driven in a multiple-pulse time delayed manner.

5 Claims, 14 Drawing Sheets

LOW FREQUENCY BROAD BAND ULTRASONIC TRANSDUCERS

CROSS-REFERENCE TO RELATED APPLICATIONS

This U.S. non-provisional patent application claims the benefit of and priority to U.S. provisional patent application Ser. No. 61/641,004 filed May 1, 2012 entitled "Low Frequency Broad Band Ultrasonic Transducers", and to U.S. provisional patent application Ser. No. 61/673,823 filed Jul. 20, 2012 entitled "Low Frequency Broad Band Ultrasonic Transducers", the entire contents of each of which is specifically incorporated herein by reference.

FIELD OF THE INVENTION

The present invention relates to the field of ultrasonic transducers and, more particularly, to low frequency pulse-echo ultrasonic transducers. Such transducers can be employed, for example, in well cement bond evaluation applications.

BACKGROUND

When forming a well, such as an oil or natural gas well, a hole is drilled in the earth using an earth-penetrating drill bit situated at an end of one or more drilling tools which, in turn, are disposed at the end of numerous sections of pipe (i.e. a drilling assembly). The drilling assembly is then rotated to affect the drilling process. Typically, a fluid mixture known as mud is circulated into the well during drilling. The mud then flows around the drilling tools and out of the hole along with drilling debris. After the hole is formed a metal casing such as pipe is situated in the hole. Thereafter, cement is provided between the well casing and the hole wall in order to fill space between the outside of the well casing and the hole wall. Once the cement hardens, the well casing is bonded to the hole wall.

Figure 1:
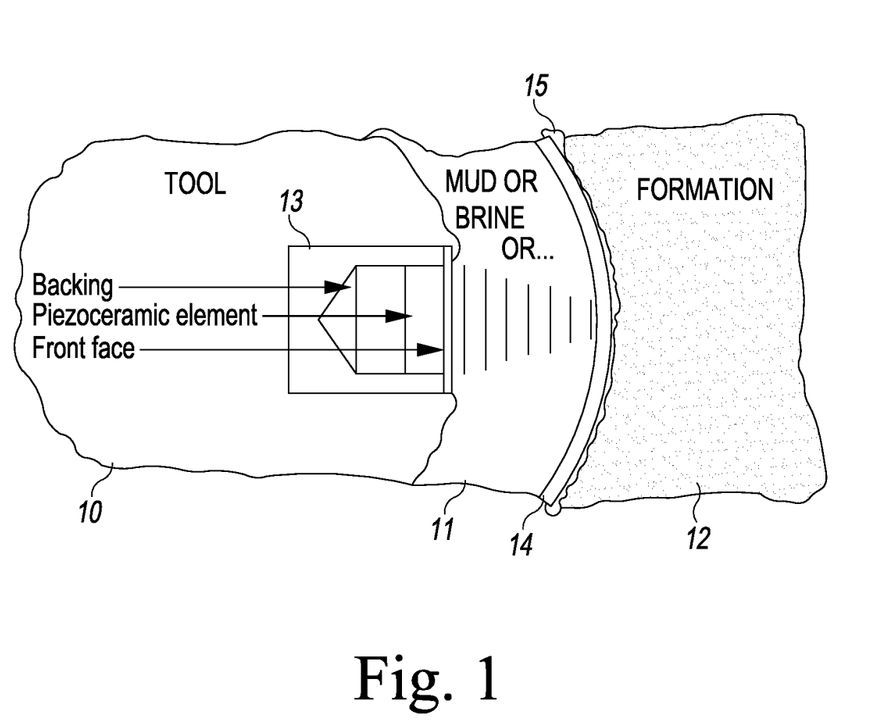
FIG. 1 is an illustration of a pulse-echo ultrasonic transducer of a down-hole tool being used for cement bond evaluation in a well.
Figure 2A:
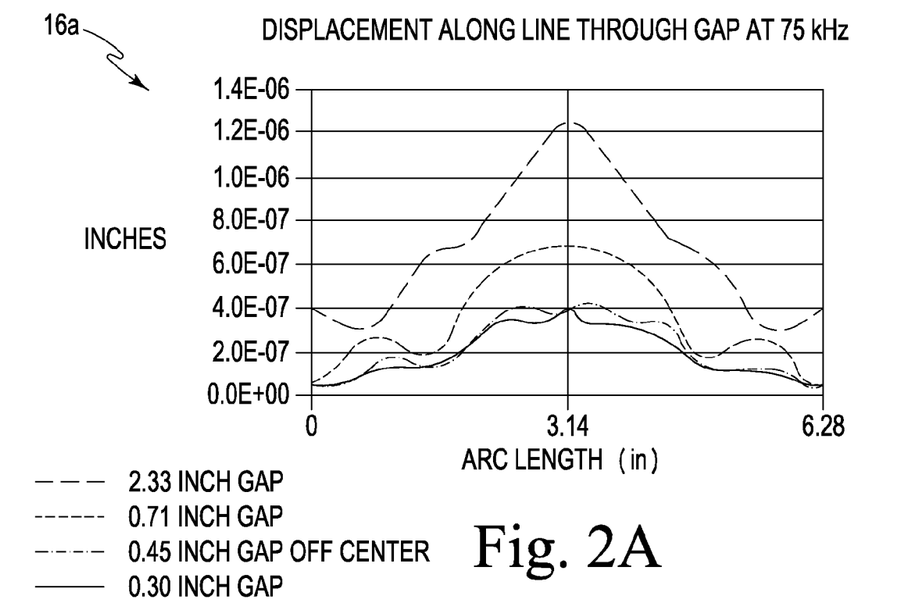
FIG. 2A depicts a graph of displacement versus arc length for different sizes of cement bond gaps illustrating the effect of an ultrasonic frequency of 75 kHz on cement bond evaluation when directed through the gap.
Figure 2B:
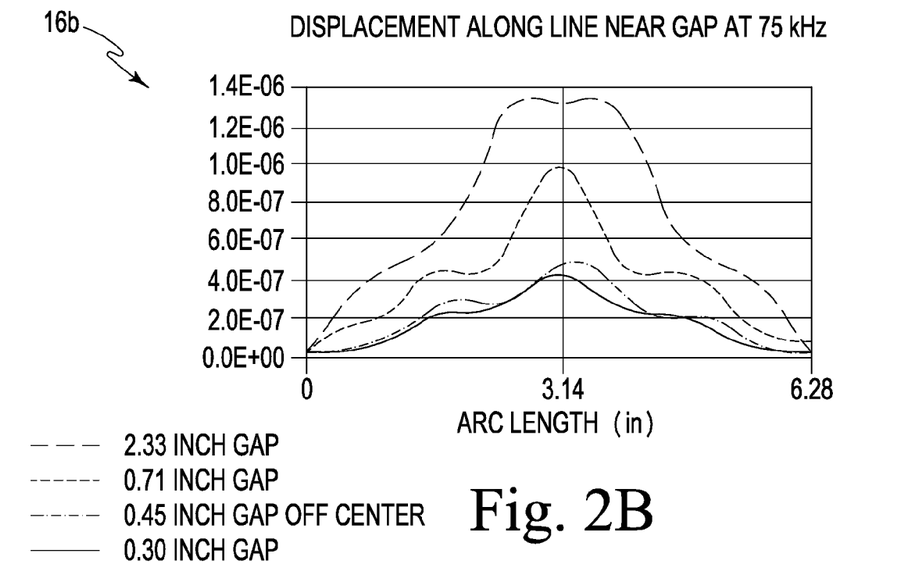
FIG. 2B depicts a graph of displacement versus arc length for different sizes of cement bond gaps illustrating the effect of an ultrasonic frequency of 75 kHz on cement bond evaluation when directed near the gap.
Figure 2C:
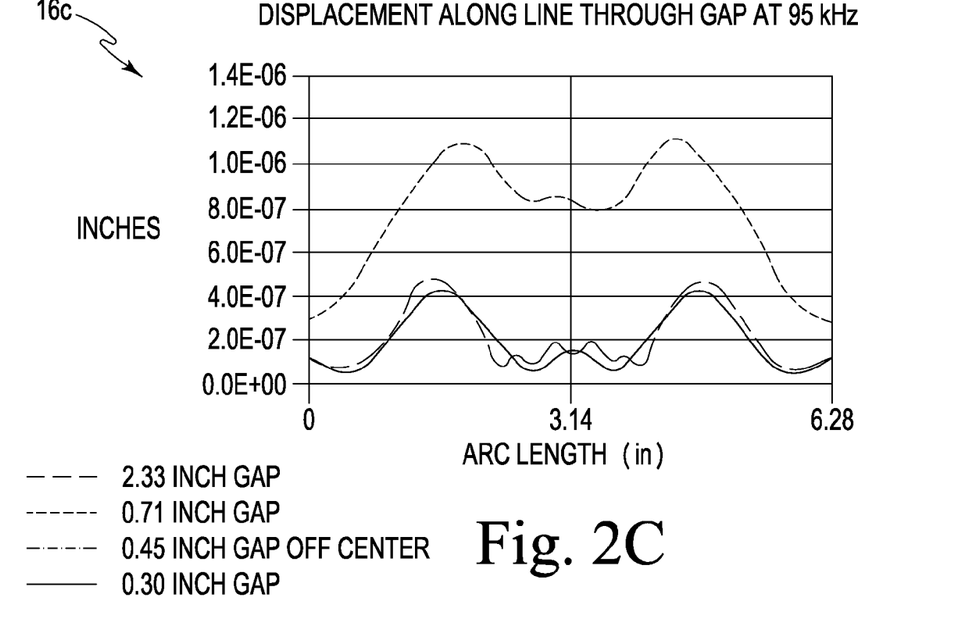
FIG. 2C depicts a graph of displacement versus arc length for different sizes of cement bond gaps illustrating the effect of an ultrasonic frequency of 95 kHz on cement bond evaluation when directed through the gap.
Figure 2D:
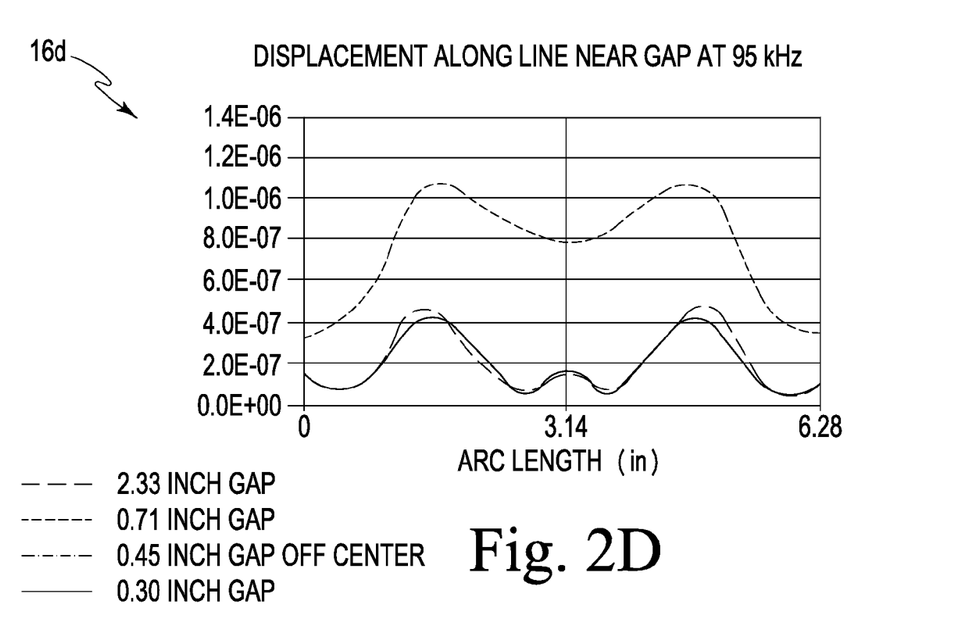
FIG. 2D depicts a graph of displacement versus arc length for different sizes of cement bond gaps illustrating the effect of an ultrasonic frequency of 95 kHz on cement bond evaluation when directed near the gap.
Figure 2E:
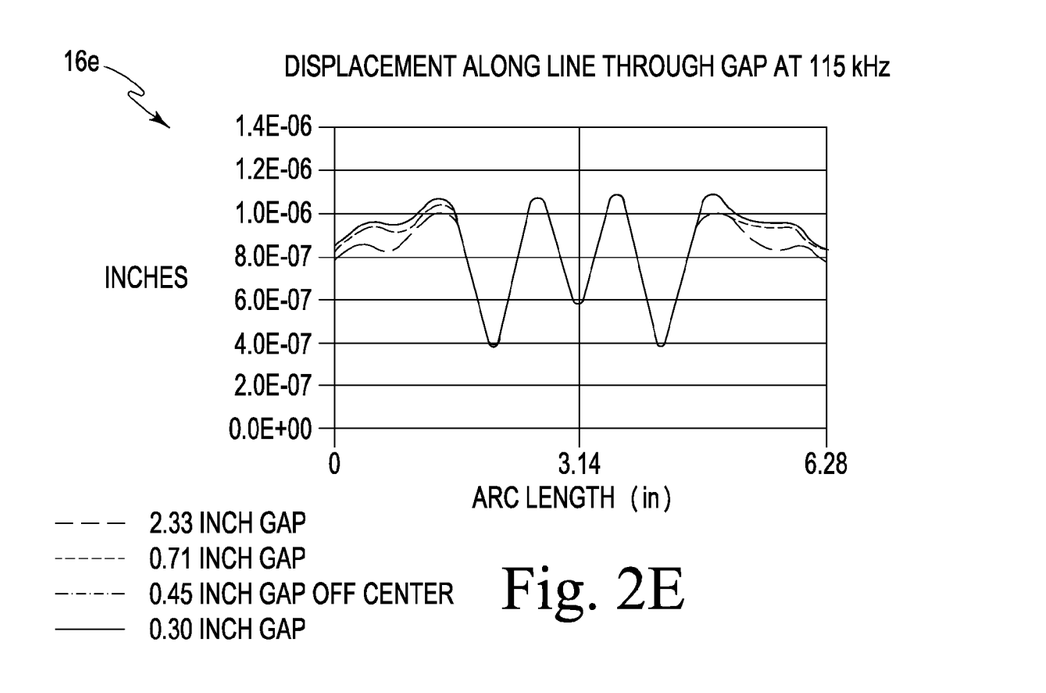
FIG. 2E depicts a graph of displacement versus arc length for different sizes of cement bond gaps illustrating the effect of an ultrasonic frequency of 115 kHz on cement bond evaluation when directed through the gap.
Figure 2F:
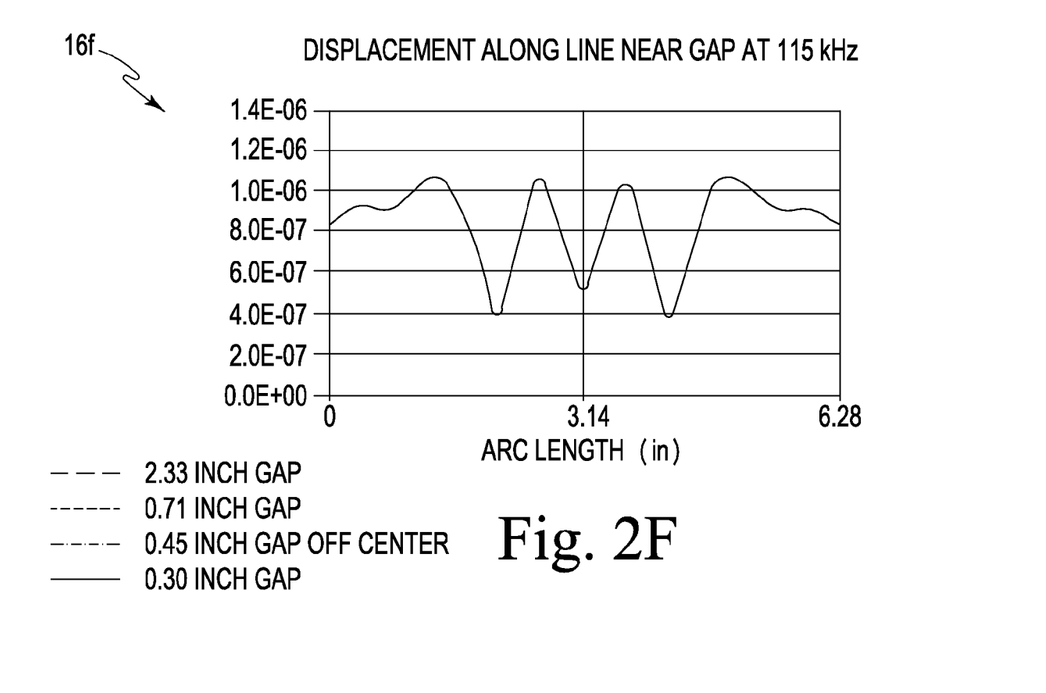
FIG. 2F depicts a graph of displacement versus arc length for different sizes of cement bond gaps illustrating the effect of an ultrasonic frequency of 115 kHz on cement bond evaluation when directed near the gap.

It is important for the quality and integrity of a well that no gaps, air pockets or the like exist between the well casing and the hole wall. In order to determine whether gaps, air pockets and/or the like exist between the outer well casing and the hole wall, cement bond evaluation (CBE) is performed. CBE is performed on new wells as well as existing wells by introducing a tool having a CBE component into the well which obtains data that is then analyzed. The CBE component is typically an acoustic (e.g. ultrasonic) transducer configured to operate in a pulse-echo mode. Such is depicted in FIG. 1 wherein a down-hole tool (tool) 10 having an ultrasonic transducer assembly 13 situated in a side thereof is shown sending an ultrasonic signal (represented by the parallel lines) through the mud 11 toward the well casing 14. The ultrasonic transducer assembly 13 includes a piezo-ceramic element situated between an ultrasonic signal dampening backing and a tuned PEEK front face. Behind the well casing 14 is cement 15 and the formation 12 in which the hole was formed.

The ultrasonic transducer 13 generates an ultrasonic pulse that is directed at the well casing 14. The transmitted ultrasonic pulse is reflected off the well casing 14 and returned to the transducer 13. Additionally, a portion of the transmitted ultrasonic pulse travels through the well casing 14 and cement 15, and is reflected off of the formation 12 back to the transducer 13. The ultrasonic reflections cause further ultrasonic reflections that travel back to the transducer. Eventually, the ultrasonic reflections subside. However, by analyzing the reflected ultrasonic signals (i.e. the response signals of the casing and cement), it can be determined whether gaps, air pockets and/or the like, exist in the cement 15 (i.e. between the well casing and the hole wall), as well as the estimated size of the gap, air pocket and/or the like.

Most down-hole pulse-echo ultrasonic transducers operate in the range of 400 kHz to 1 MHz. Selecting an operating frequency for a pulse-echo ultrasonic transducer is a trade-off between transducer size, focal spot size, resolution, ringdown, attenuation and frequency-specific phenomena. The thickness of the well casing is also sensitive to frequency. Transducer size, focal spot size, resolution, and ringdown generally favor higher frequency ultrasonic transducers, while attenuation generally favors lower frequency. There are also more of the specific phenomena at lower frequencies, particularly with respect to well casing (pipe) used for deep wells having a one inch (1") or greater wall thickness.

Referring to FIGS. 2A-F, various graphed results are shown for tests conducted by the present inventors regarding the effect of ultrasonic frequency on response. Particularly, three ultrasonic transducers of low frequency (115 kHz, 95 kHz, 75 kHz) were used with respect to four (4) well test structures having known gaps in the cement between the well casing and the well formation (i.e. one well test structure having an 0.30 inch gap, one well test structure having an 0.45 inch gap, one well test structure having an 0.71 inch gap, and one well test structure having a 2.33 inch gap—using a section of 6 inch OD steel pipe with a 1 inch thick wall). As seen in graphs 16e of FIGS. 2E and 16f of FIG. 2F, the 115 kHz ultrasonic transducer does not produce responses which allow discrimination between the various gaps. In graphs 16c of FIGS. 2C and 16d of FIG. 2D, the 95 kHz ultrasonic transducer produces responses which allow discrimination of only the 0.71 inch gap from the other gaps. In graphs 16a of FIGS. 2A and 16b of FIG. 2B, however, the 75 kHz ultrasonic transducer produces responses which allow discrimination of all the gaps. Therefore, for down-hole CBE applications where the well casing is relatively thick (i.e. 1" or greater), lower frequency ultrasonic transducers would be preferable.

Figure 3:
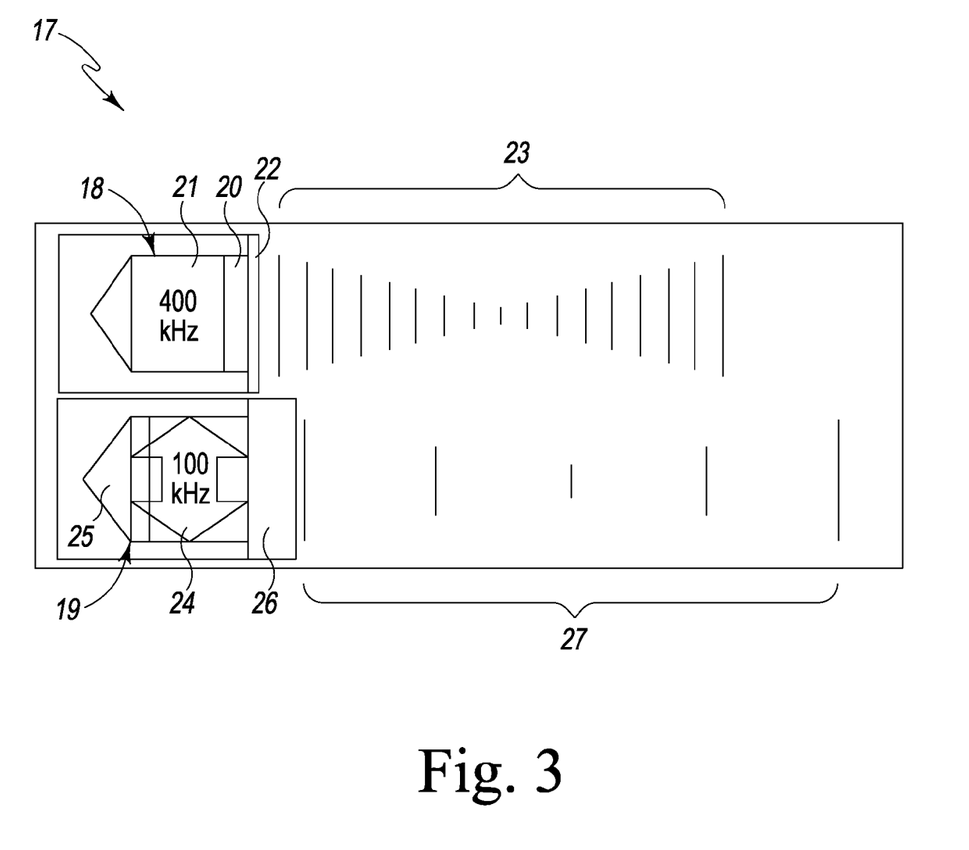
FIG. 3 is a depiction illustrating challenges in using a 400 kHz ultrasonic transducer versus a 100 kHz ultrasonic transducer for cement bond evaluation.

A problem with low frequency transducers for CBE applications however is their size since down-hole tools only have so much room for the ultrasonic transducer assembly. Referring to FIG. 3, the problem of size of the ultrasonic transducer assembly is depicted. Particularly, the illustration 17 depicts a 400 kHz ultrasonic transducer assembly 18 and a 100 kHz ultrasonic transducer assembly 19 within the limited space within a down-hole tool. The 400 kHz ultrasonic transducer 18 includes a piezo-ceramic element 20 affixed to an ultrasonic dampening backing with a PEEK face 22 that produces a 400 kHz ultrasonic signal 23.

The 100 kHz ultrasonic transducer 19 includes a piezo-ceramic element 24 affixed to an ultrasonic dampening backing 25 with a PEEK face 26 that produces a 100 kHz ultrasonic signal 27. Every change associated with dropping the operating frequency of the ultrasonic transducer makes achieving bandwidth and ringdown goals more difficult. Particularly, the ratio of ultrasonic dampening backing to the piezo-ceramic element drops, the attenuation in the backing drops by sixteen times (16×), the piezo-ceramic volume versus backing surface area drops by four times (4×), the number of cycles in which to dissipate energy drops by four times (4×) (wherein Q=E/ΔE per cycle), and the thickness versus diameter of the piezo-ceramic approaches 3:1 or worse. As denoted by the double-headed arrow within the piezo-ceramic element 24, the 100 kHz piezo-ceramic element 24 has a significant unwanted radial component.

Figure 4:
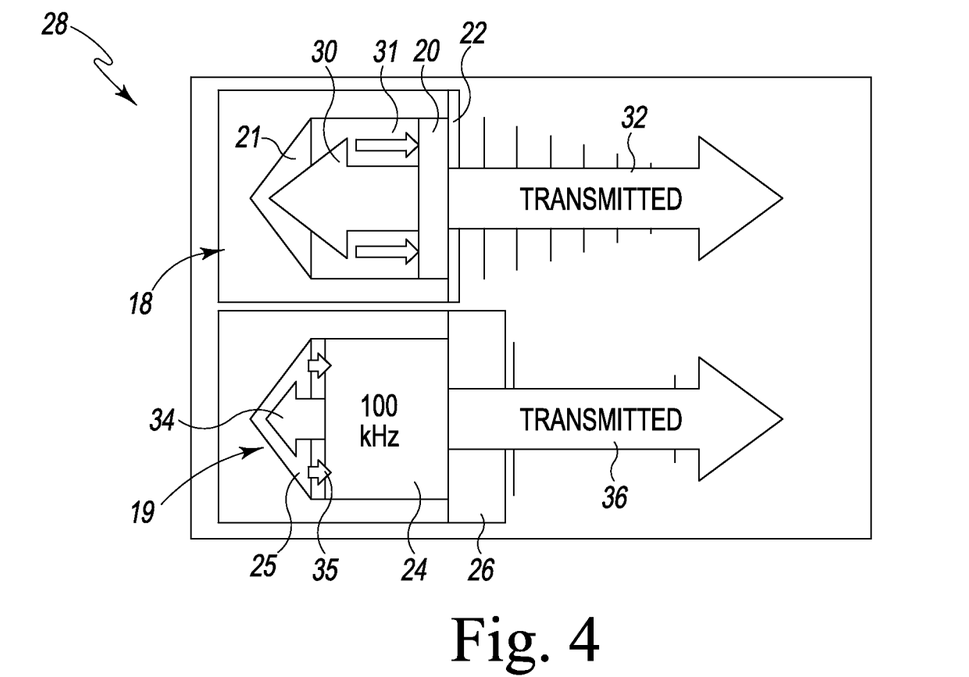
FIG. 4 is a depiction illustrating ultrasonic energy flow from the 400 kHz ultrasonic transducer versus the 100 kHz ultrasonic transducer.

FIG. 4 illustrates ultrasonic energy flow from the 400 kHz ultrasonic transducer assembly 18 and the 100 kH-z ultrasonic transducer assembly 19. With respect to the 400 kHz ultrasonic transducer assembly 18 (representing typical ultrasonic transducers), ultrasonic energy emitted by the piezo-ceramic element 20 is dissipated in the backing 21 as represented by the large arrow 30. Particularly, nearly 50% of the ultrasonic energy projected into the backing 21 is dissipated, while a 5%-10% heat loss occurs in the piezo-ceramic 20. Moreover, as represented by the two small arrows 31, there is minimal coherent echoing from the backing 21. As represented by the large arrow 32 labeled "Transmitted", the remainder of the ultrasonic energy is emitted by the piezo-ceramic element 20. With respect to the 100 kHz ultrasonic transducer assembly 19 (representing low frequency ultrasonic transducers), some of the ultrasonic energy emitted by the piezo-ceramic element 26 is dissipated in the backing 21 (as represented by the large arrow 34), but not as much as the 400 kHz ultrasonic transducer assembly 18 since the backing 25 of the 100 kHz ultrasonic transducer assembly 19 is smaller. Moreover, as represented by the two small arrows 35, there is more echo resulting from the backing 25. As represented by the large arrow 36 labeled "Transmitted", the remainder of the ultrasonic energy is emitted by the piezo-ceramic element 26.

Therefore, while it would be advantageous to have a low frequency (i.e. ~100 kHz) ultrasonic transducer for use in CBE and other applications, the aforementioned problems with respect to low frequency (i.e. 100 kHz) ultrasonic transducers makes current designs unsuitable and/or unusable in down-hole CBE applications. As the ability of the backing to absorb energy from the transducer decreases (due to limited space in a downhole tool for a transducer assembly), loss in the transducer must be increased to meet bandwidth goals.

SUMMARY OF THE INVENTION

Disclosed herein are low frequency pulse-echo ultrasonic transducers especially suited for use in downhole cement bond evaluation, but usable for various applications. The present low-frequency pulse-echo ultrasonic transducers have an operating frequency around 100 kHz, a ringdown of less than 30 dB at t=2f/v (where f=focal length, and v=speed of sound), greater than 100% bandwidth, and an acoustic assembly depth (front face, piezoceramic element(s), and backing) of less than 1.5 inches.

In one form, the present low frequency pulse-echo ultrasonic transducer comprises a transducer stack having alternating layers of a piezoceramic element and an ultrasonic dampening or attenuating element. The ultrasonic dampening or attenuating element is preferably acoustic impedance matched to the piezoceramic elements in order to reduce the Q of the transducer stack. Roughly speaking, Q is the inverse of bandwidth. Particularly, $Q=E/\Delta E$ where $\Delta E$ is energy lost in one cycle. The Q of a transducer must approach 1 for the bandwidth to approach 100%.

In another form, the present low frequency pulse-echo ultrasonic transducer comprises an assembly having the present transducer stack disposed on an acoustic dampening or attenuating backing and a front face element. The front face element is preferably, but not necessarily, a ¼ wavelength (¼λ) PEEK (polyetheretherketone) or titanium structure.

In another form, the present low frequency pulse-echo ultrasonic transducer comprises a composite made from a lead metaniobate (PmN, PN, LM, PbNb or other label). The composite is characterized by an array of piezoceramic posts (units) set into a low acoustic impedance matrix. The piezoceramic units can be made from a lead metaniobate known as "K-81" and "K-91" as provided by the assignee, Piezo Technologies of Indianapolis, Ind.

In yet another form, the present low frequency pulse-echo ultrasonic transducer comprises a composite stack, preferably, but not necessarily, made from a lead metaniobate. Each unit of the composite stack consists of a transducer stack as described above.

In still another form, the present low frequency pulse-echo ultrasonic transducer comprises a composite stack, preferably, but not necessarily, made from a lead metaniobate, wherein multiple drive elements allow driving individual elements at different times. The multiple drive elements can be phase delayed relative to one another to provide a broader frequency range.

The present low frequency pulse-echo transducers may be used in a variety of applications, including medical, remote sensing, and wells for recovering fossil fuels.

BRIEF DESCRIPTION OF THE DRAWINGS

Like reference numbers indicate the same or similar parts throughout the several figures.

DETAILED DESCRIPTION

Figure 5:
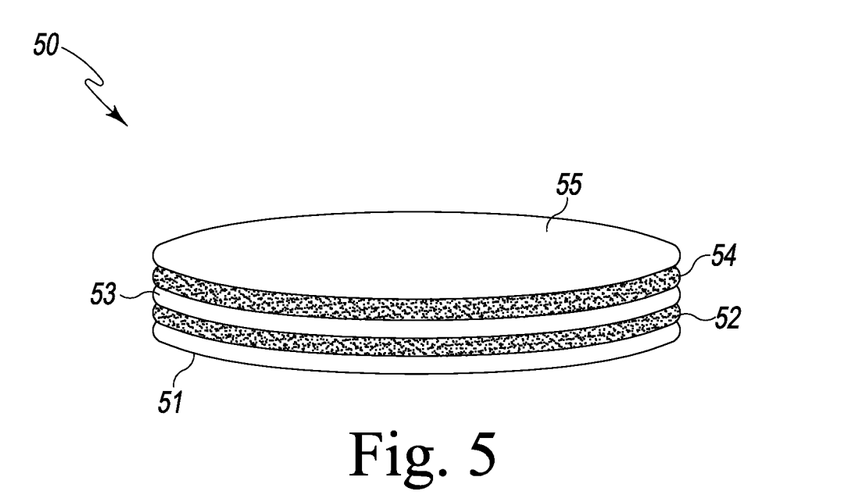
FIG. 5 is an illustration of a low frequency ultrasonic transducer stack fashioned in accordance with the present principles.

Referring to FIG. 5, there is depicted a general illustration of a low-frequency pulse-echo acoustic (e.g. ultrasonic) transducer stack, generally designated 50, fashioned in accordance with the present principles. The acoustic transducer stack 50 is characterized by alternating layers of an acoustic (e.g. ultrasonic or piezoceramic) element and an ultrasonic dampening or attenuating element. In FIG. 5, the acoustic transducer stack 50 has a first piezoceramic element 51, a first acoustic dampening element 52 situated on the first piezoceramic element 51, a second piezoceramic element 53 situated on the first acoustic dampening element 52, a second acoustic dampening element situated on the second piezoceramic element 53, and a third piezoceramic element 55 situated on the second acoustic dampening element 52. The acoustic damping elements 52, 54 are preferably acoustic impedance matched to the piezoceramic elements 51, 53, 55 in order to reduce the Q of the transducer stack. It should be appreciated that the acoustic stack 50 shown in FIG. 5 is illustrative and not limiting. Therefore, acoustic stacks of any number of layers are contemplated. The dampening elements or layers provide for acoustic attenuation through the piezoceramic elements in order to achieve bandwidth goals.

Figure 6:
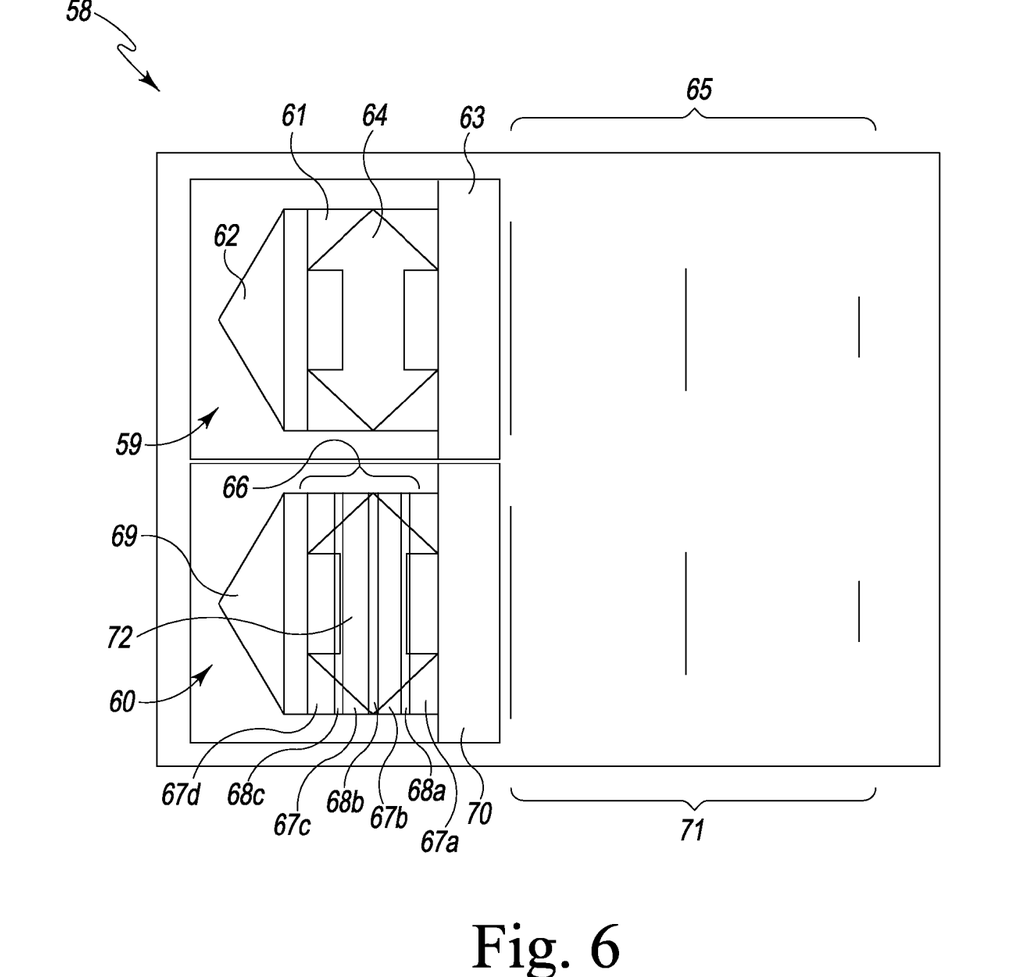
FIG. 6 is a depiction illustrating planar or radial noise from a single element 100 kHz ultrasonic transducer and the present 100 kHz ultrasonic transducer stack.

In FIG. 6 an illustration 58 is shown depicting two ultrasonic pulse-echo transducers or transducer assemblies 59 and 60. The acoustic pulse-echo transducer 59 is a prior art transducer having a single piezoceramic element 61 applied to an acoustic dampening backing 62 with a front face 63. The acoustic pulse-echo transducer 59 emits an acoustic signal 65 while also radiating in the radial direction as represented by the double-headed arrow 64. The acoustic pulse-echo transducer 60 is formed in accordance with the present principles and thus has a piezoceramic stack 66 formed by four piezoceramic elements 67a, 67b, 67c, 67d and three acoustic damping elements 68a, 68b, 68c situated therebetween, the stack 66 applied to an acoustic dampening backing 69 with a front face 70. The acoustic pulse-echo transducer 60 emits an acoustic signal 71 while also radiating in the radial direction as represented by the double-headed arrow 72.

Figures 7A, 7B:
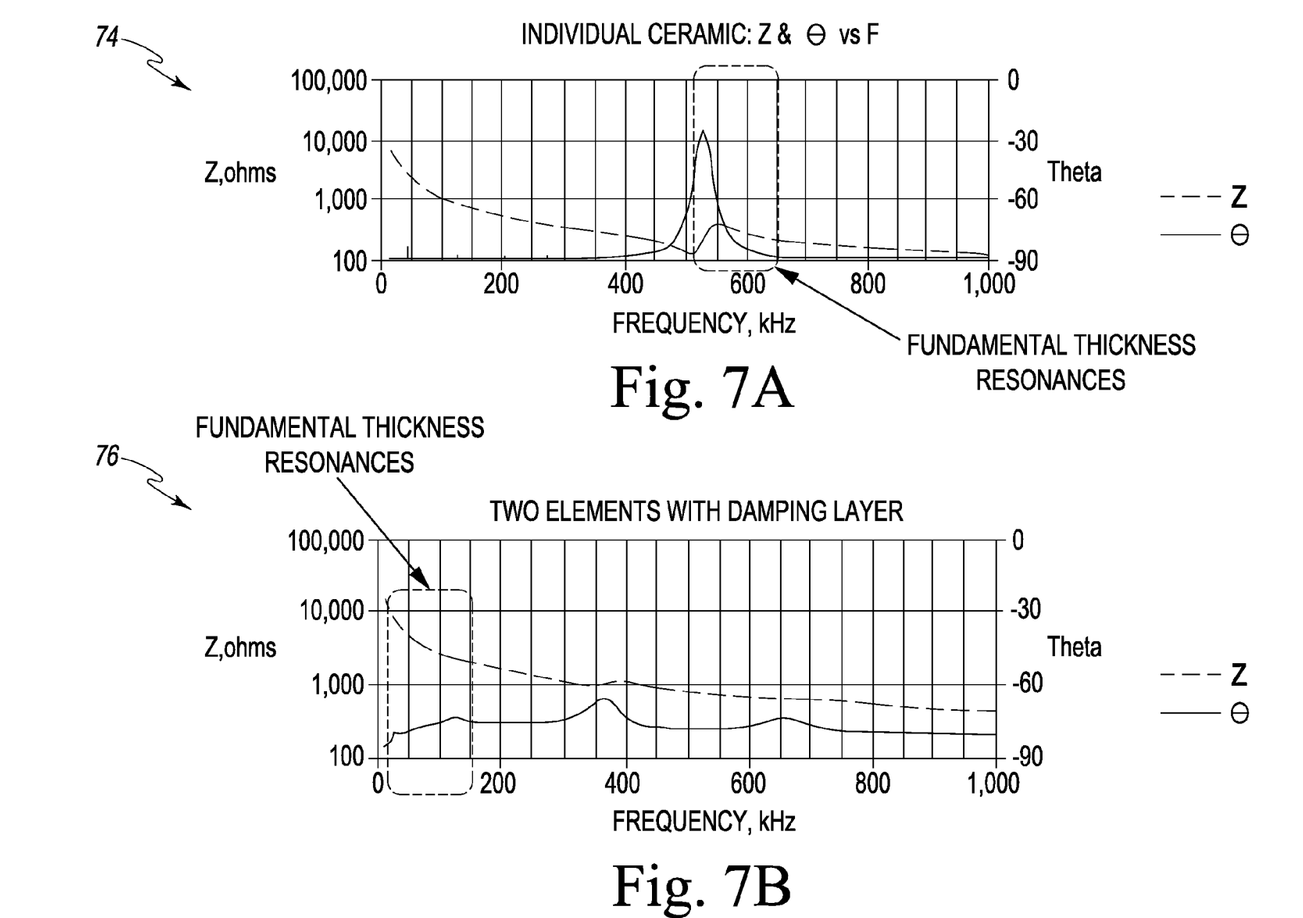
FIG. 7 shows two graphs, one illustrating the fundamental thickness resonance of an individual (single) element 100 kHz ultrasonic transducer, the other illustrating the fundamental thickness resonance of a two (multiple) element 100 kHz ultrasonic transducer.

As illustrated in the graph 74 of FIG. 7, the fundamental thickness resonance of the single element pulse-echo acoustic transducer 59 is roughly 500 kHz. As illustrated in the graph 76 of FIG. 7, the fundamental thickness resonance of the present multiple element pulse-echo acoustic transducer 60 is roughly 150 kHz. This is a drop of 350 kHz and with a Q that has dropped to below 1. Therefore, it can be seen that an acoustic stack having the same physical size as a single acoustic element provides an acoustic signal of a lower frequency while dampening an appreciable amount of unwanted acoustic radiation.

Figure 8:
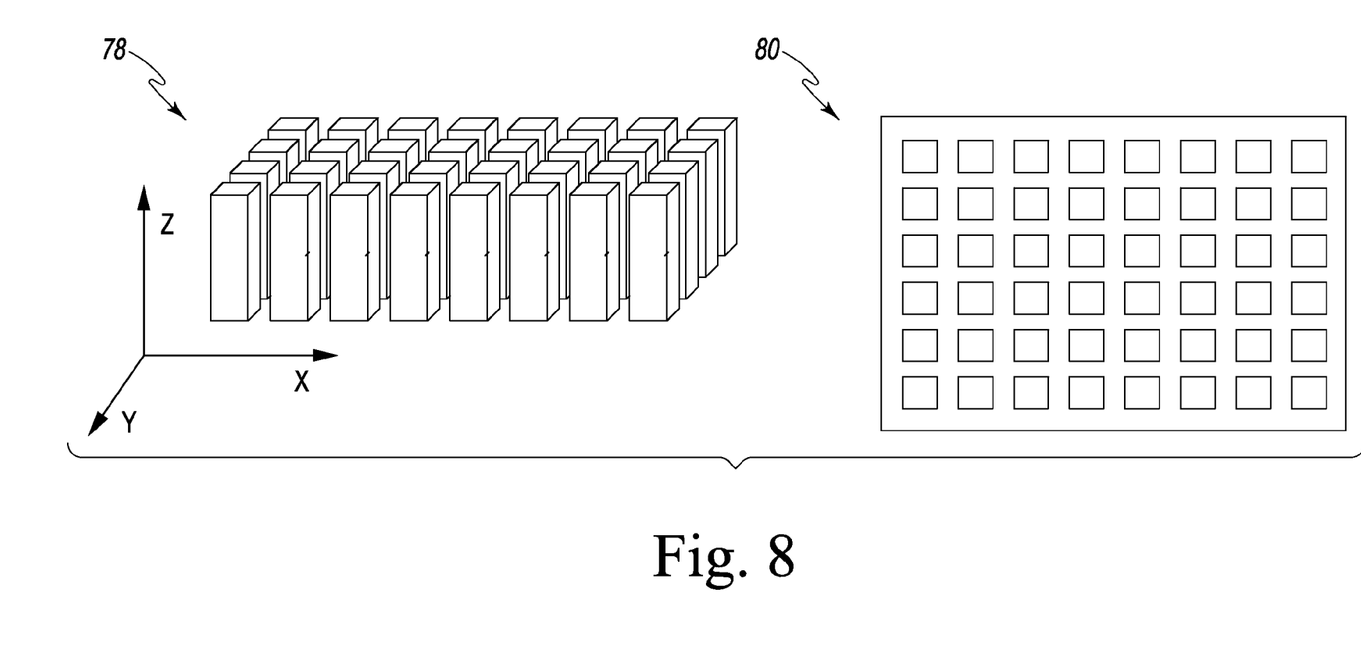
FIG. 8 is an illustration of a composite PmN ultrasonic transducer structure.

Referring to FIG. 8, a composite lead metaniobate transducer per the present invention is shown. The composite lead metaniobate transducer is composed of a plurality of piezoceramic posts 78, the Z-axis of which is the primary operating axis. The plurality of piezoceramic posts 78 are set in a low acoustic impedance matrix 80. The matrix largely decouples motion in the X axis and the Y axis. The radial ringdown component of a composite lead metaniobate transducer is thus almost entirely eliminated.

Figure 10:
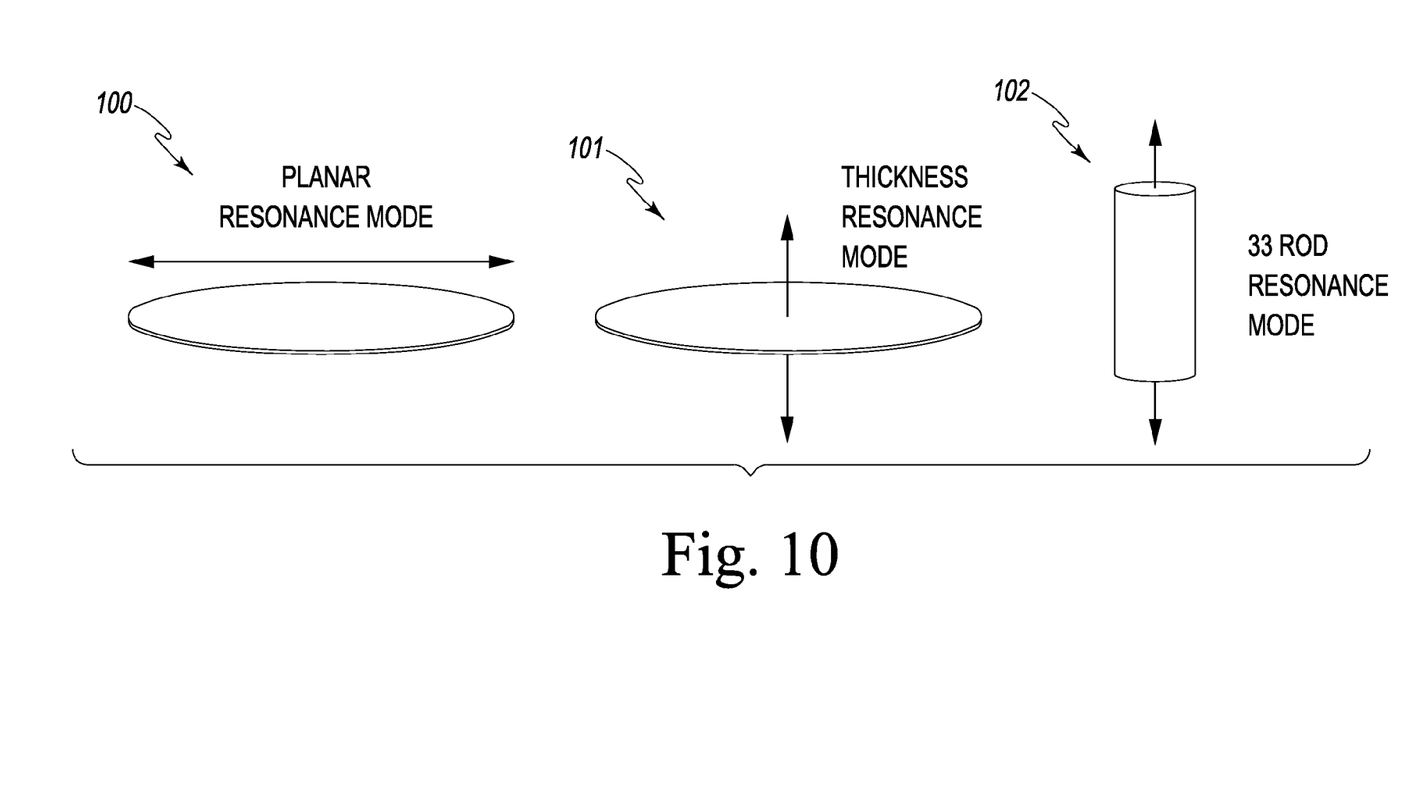
FIG. 10 is an illustration of the three modes of acoustic resonance in an acoustic transducer.

A lead metaniobate, such as K-81 and K-91 piezoceramics from Piezo Technologies of Indianapolis, Ind., is chosen for the composite transducer. A composite transducer made from a lead metaniobate is not expected. However, in view of the following characteristics, a composite transducer, including a composite transducer stack as provided herein, according to the present principles uses a lead metaniobate. The frequency and mode are related through the speed of sound in the material and the geometry of the part. Referring to FIG. 10, the three modes of acoustic resonance in an acoustic transducer are illustrated. Acoustic transducer 100 illustrates the planar resonance mode. Acoustic transducer 101 illustrates the thickness resonance mode. Acoustic transducer 102 illustrates the 33 Rod resonance mode. In the planar and thickness modes, the diameter is much greater than the thickness. In the planar mode the resonance frequency is the inverse of the time required for sound to move across the width of the element. In the thickness mode, the resonance frequency is the inverse of the time required for sound to move across the thickness of the element. In the rod mode, resonance frequency is calculated like the thickness mode except the diameter is much smaller than the thickness.

The coupling coefficient kr determines how much energy can be converted from electricity to sound or from sound to electricity by a piezoelectric material. The maximum energy converted is $E=(k_x)^2$ wherein the "x" subscript refers to the mode of the piezoelectric motion (i.e. P=planar mode, T=thickness mode, 33=rod mode). Using a lead metaniobate for low frequency composites as provided herein improves the performance of the composite for only one primary reason: unwanted planar (radial) mode is damped. For low frequency transducers, planar mode tends to ring longer—which is undesirable. The backing used to suppress ringing or ringdown of the thickness mode is less effective at controlling ringing or ringdown in the radial mode. Therefore, using a lead metaniobate for a composite controls radial mode ringing/ringdown. A side benefit is that reduced impedance of the elements in a composite minimizes losses at interfaces of the present transducer stack. Thus, it is easier to match elements to a backing. With a lead metaniobate composite, the fundamental planar mode resonance (ringdown) is orders of magnitude less than a lead zirconate titanate (PZT) composite.

Figure 9:
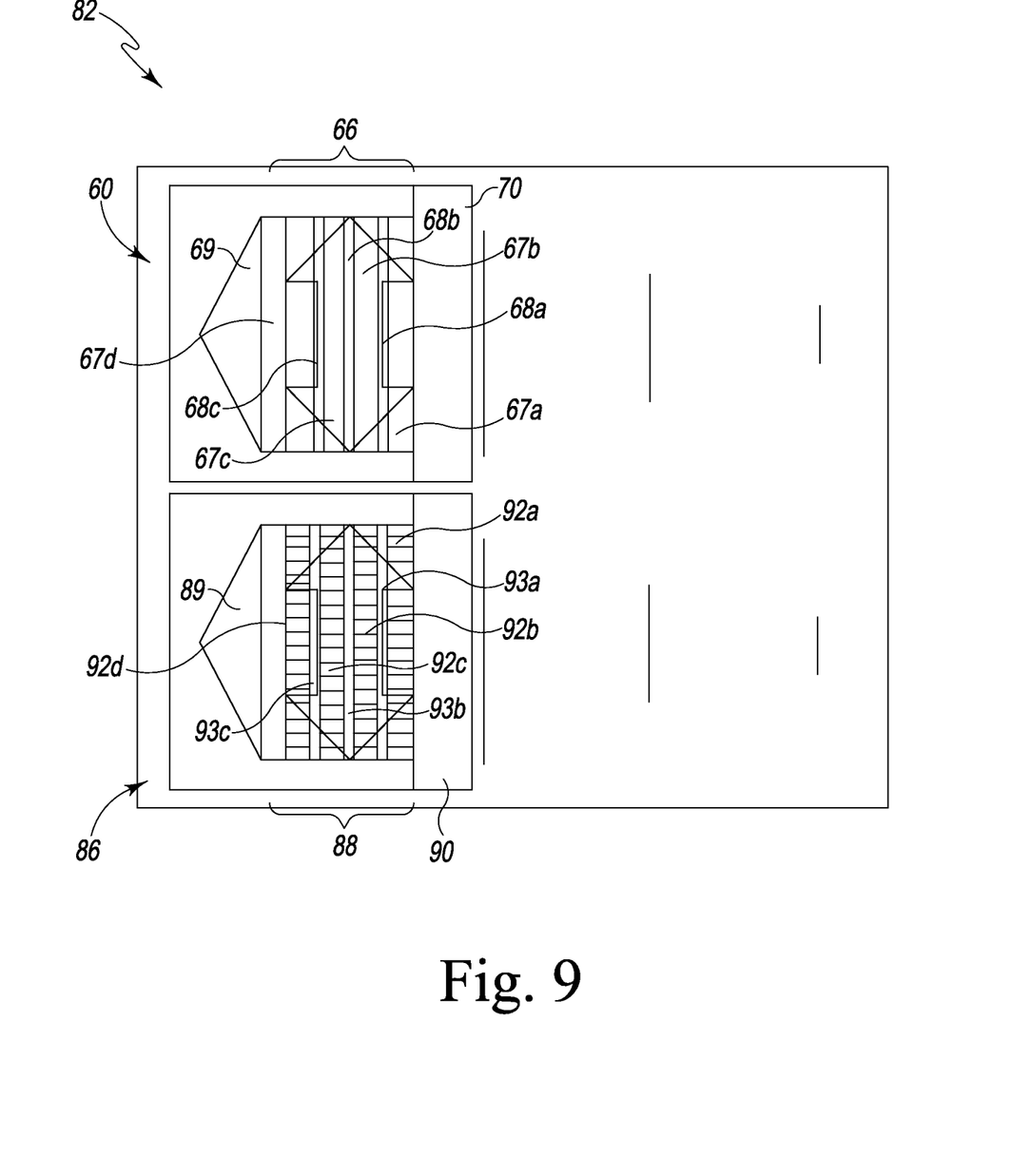
FIG. 9 is a depiction illustrating two embodiments of a low frequency ultrasonic transducer assembly fashioned in accordance with the present principles, one utilizing a transducer stack and the other utilizing a composite PmN transducer stack.

Referring now to FIG. 9, an illustration 82 is provided depicting the present acoustic pulse-echo transducer 60 shown and described above with reference to FIG. 6. The transducer 60, while formed with an acoustic stack in accordance with the present principles, still exhibits some unwanted planar (radial) noise as represented by the two-headed arrow within the transducer stack 66. In order to reduce the planar noise, an acoustic pulse-echo transducer assembly 86 fashioned in accordance with an aspect of the present principles, provides an acoustic lead metaniobate composite stack 88 applied to a backing 89 with a front face 90. In this embodiment, the acoustic lead metaniobate composite stack 88 is formed by four piezoceramic composite elements 92a, 92b, 92c, 92d and three acoustic damping elements 93a, 93b, 93c situated therebetween. The acoustic composite stack 88 reduces unwanted planar (radial) noise as represented by the double-headed arrow in shadow within the acoustic composite stack 88. Of course, stacks having different number of acoustic elements and dampening layers may be used. Moreover, with the acoustic lead metaniobate composite stack 88, its Q approaches one (1) allowing a small backing. Furthermore, the planar (radial) mode echoes are minimized.

In all cases a housing for the backing and the transducer stack is preferably, but not necessarily, formed of polyetheretherketone (PEEK). The backing and the dampening layers/elements of the stack are formed of a high acoustic impedance material such as tungsten (having an acoustic impedance of ~80 MRayls) or of a mixture of high acoustic impedance materials (e.g. an epoxy/polymer of ~20 MRayls mixed with powdered tungsten). Of course, other high acoustic impedance materials and/or mixtures may be used.

The front face of the present low frequency acoustic transducers is formed of a small thickness material that resists abrasion One such material is a polymer and particularly a polymer known as PEEK (polyetheretherketone). PEEK has an acoustic impedance of ~4.5 MRayls and can be made thin. For a 100 kHz acoustic transducer as provided herein, a one-quarter wavelength ($\frac{1}{4}\lambda$) PEEK face is about 0.28" thick. Of course, other materials and thicknesses may be used.

In accordance with another aspect of the present invention, the acoustic stack in all its forms as described herein may be driven or operated as a stacked array wherein its multiple drive (acoustic) elements allows driving or pulsing the individual drive (acoustic) elements at different times (multi-pulsed time delayed). This provides advantages such as the rejection of sound from the back and side while maximizing the generation of sound from the front of the transducer. Thus, the individual acoustic elements of an acoustic stack as described herein may all be driven separately but with respect to each other. This manner of operating a transducer stack is shown in FIGS. 11-16 and described below with respect to a two acoustic element transducer shown without dampening layers, it being appreciated that the principles also apply to the present acoustic element/dampening layer transducer stack.

Figure 11:
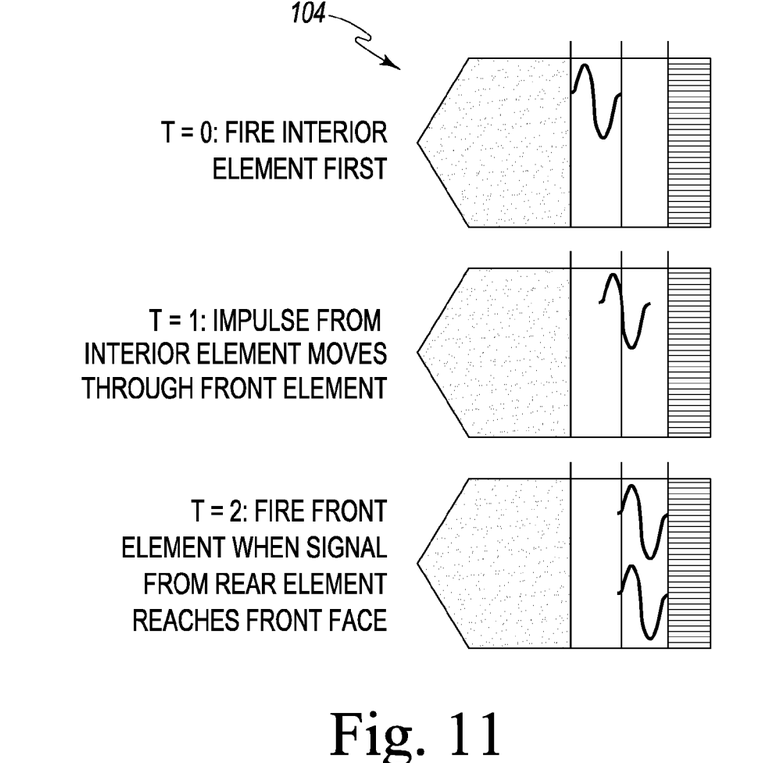
FIG. 11 is a diagram of a low frequency acoustic transducer fashioned in accordance with the present principles having two acoustic elements illustrating a manner of individually driving the two acoustic elements.

A two acoustic element transducer 104 is depicted in FIG. 11. In the top depiction of the transducer 104, at time zero (T=0), the first interior element is fired, represented by the wave in the first interior element. At T=1, represented in the middle depiction of the transducer 104, the signal or impulse (wave) from the first interior element moves through the front element. At T=2, represented in the bottom depiction of the transducer 104, the front element is fired when the impulse from the first interior (rear) element reaches the front face of the front element.

This manner of driving the present transducers (i.e. time delayed) provides effects of the delay of time on sensitivity, center frequency and bandwidth. Particularly, when the acoustic signal from the rear element is added to the acoustic signal from the front element by the above time delay method (i.e. a multi-pulse time-delayed drive transducer), an additive acoustic signal is the result. This time delayed signal may then be correlated to another delayed signal to provide noise suppression. A time correlated signal may be processed by performing the following: 1) time addition [(acoustic signal at rear at time t)+(acoustic signal at front at time t-transit)]; 2) conventional addition [(acoustic signal at front at time t)+ (acoustic signal at rear at time t)]; and 3) conventional multiplied by a time correlated signal.

Figure 12:
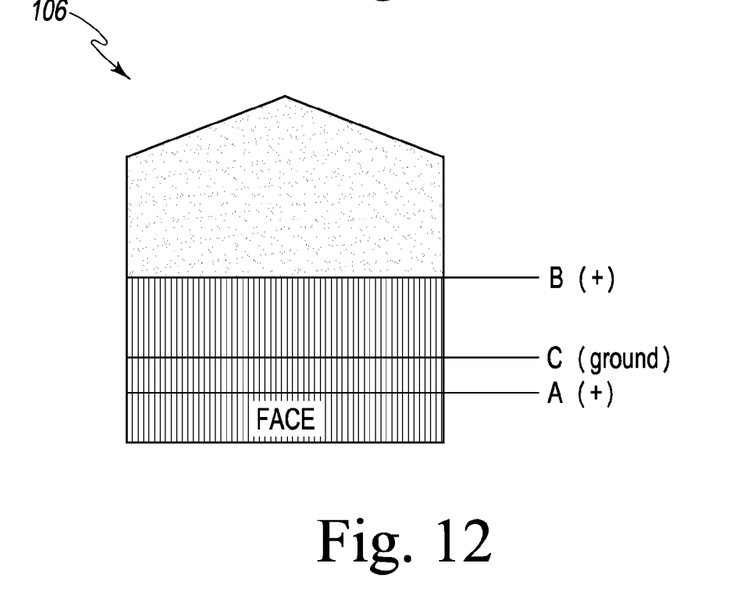
FIG. 12 is an illustration of a manner of electrically connecting and driving a low frequency acoustic transducer fashioned in accordance with the present principles.
Figure 13:
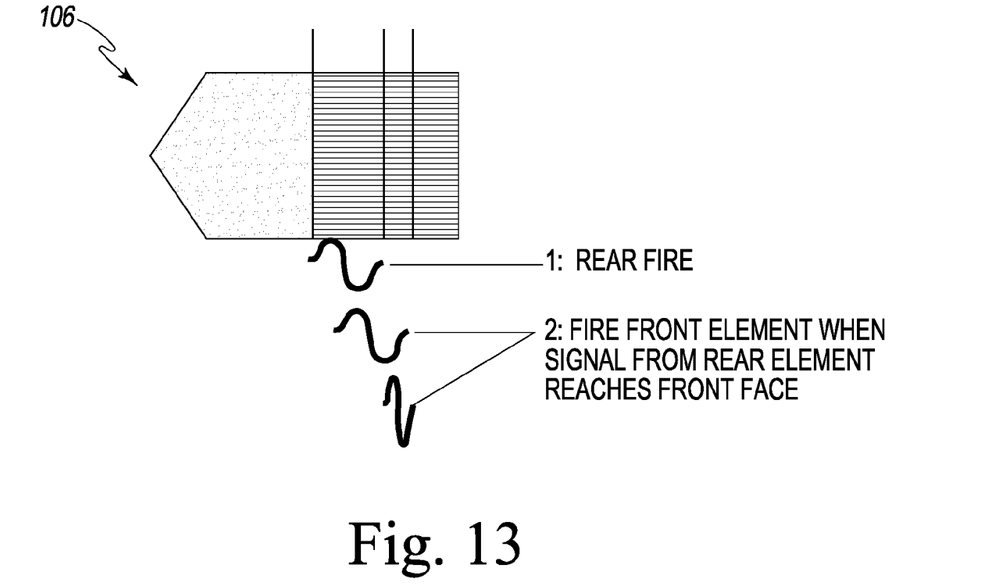
FIG. 13 is an illustration of a manner of driving the low frequency acoustic transducer of FIG. 12.

The present low frequency broad band transducers obtain a broader frequency range by firing the acoustic elements (e.g. piezoceramic pieces) separately (in time delay) or together. Referring to FIG. 12, a manner of electrically connecting and driving a two acoustic element stack transducer 106 is depicted. When A and C are connected, a high frequency acoustic signal is produced. When B and C are connected, a medium frequency acoustic signal is produced. When A and B are connected along with C, a low frequency acoustic signal is produced. It has been determined by the inventors that the strongest acoustic signal with the greatest bandwidth is obtained by driving both acoustic elements (e.g. piezoceramics) but delaying the firing (via timing of the pulse) of the front acoustic element so that its pulse is in phase with the pulse from the rear acoustic element—as shown in FIG. 13.

Figure 14:
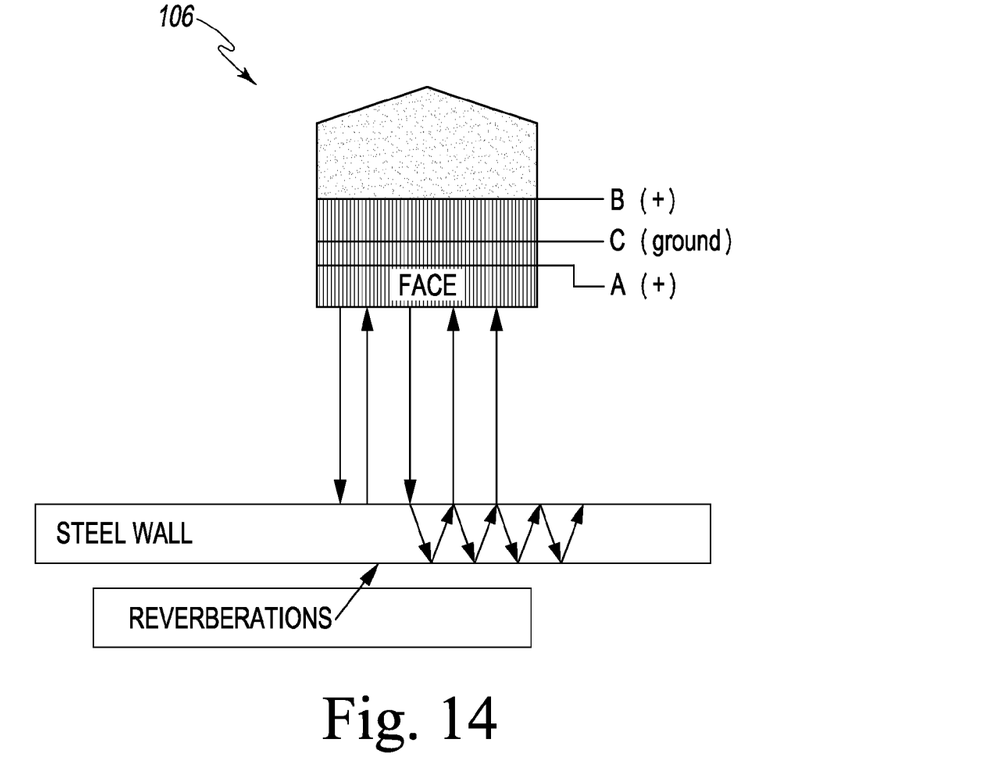
FIG. 14 is an illustration of the low frequency acoustic transducer of FIGS. 12 and 13 in a cement bond evaluation application.

A cement bond evaluation (CBE) application is depicted in FIG. 14 utilizing the connection and/or driving method described above with respect to the two acoustic element stack transducer 106. In the CBE application, an acoustic pulse is directed at the steel pipe (casing) walls used to line the bore-hole. The largest signal is the initial return echo. Reverberations in the pipe wall can be seen in the return signal after the main return. The thickness of the steel wall determines the period of the reverberations. Testing was performed using steel plates of different thicknesses as the target. The period and frequency associated with each thickness is:

| Thickness | Period | Frequency |
| --- | --- | --- |
| 0.37" | 3.32 μs | 301 kHz |
| 0.50" | 4.48 μs | 223 kHz |
| 0.75" | 6.72 μs | 149 kHz |
| 1.00" | 8.96 μs | 112 kHz |

Figure 15:
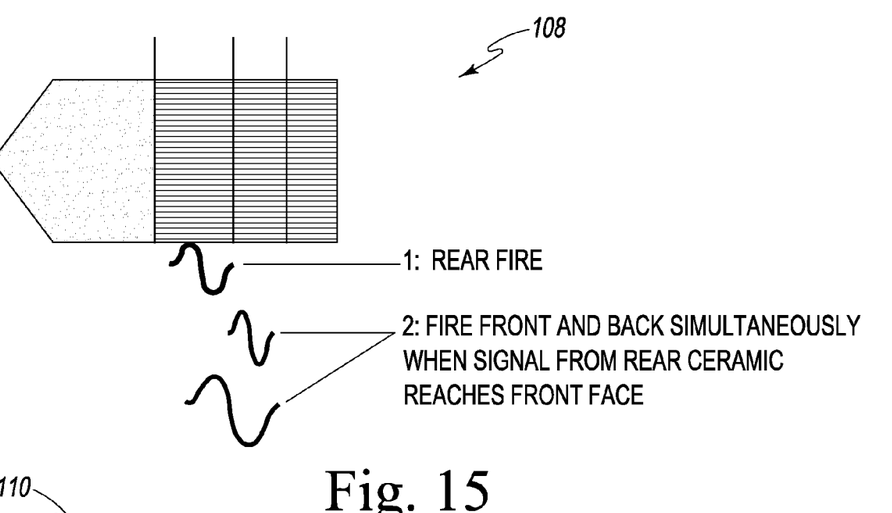
FIG. 15 is an illustration of another manner of driving a low frequency acoustic transducer fashioned in accordance with the present principles.

Another driving strategy is now presented with reference to FIG. 15. The above driving strategy increases center frequency and thus sacrifices potential bandwidth. The alternative strategy is to fire the rear acoustic element as before, but then fire both the front and back acoustic elements simultaneously upon the arrival of the rear acoustic signal at the front face. This increases the low frequency content (i.e. widens the bandwidth) while maintaining the benefits of time delayed signals.

Figure 16:
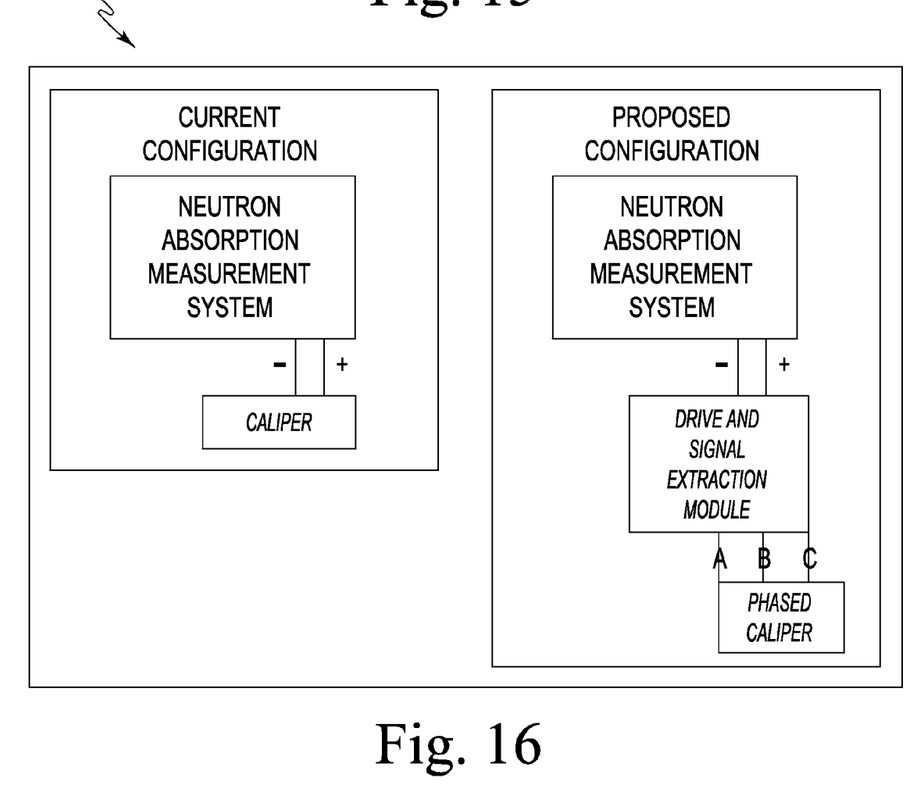
FIG. 16 is an illustration of a use for the present phased low frequency acoustic transducer (caliper).

An exemplary system 110 in which the alternative method may be used is shown in FIG. 16. A current configuration of a neutron absorption measurement system using a present caliper is shown with respect to a proposed configuration using the present multi-pulsed time delay caliper and a drive and signal extraction module.

While the present system has been described with reference to well cement bond evaluation, the present low frequency pulse-echo acoustic transducers can be used for other analysis/measurement and/or non-destructive testing and/or analysis of other structures, assemblies, formations, items and or things.

Those of skill in the art will understand that various details of the invention may be changed without departing from the spirit and scope of the invention. Furthermore, the foregoing description is for illustration only, and not restrictive in character, it being understood that only illustrative embodiments thereof have been show and described and that all changes and modifications that are within the scope of the following claims are desired to be protected.

Any and all references cited in this specification are incorporated herein by reference to the extent that they supplement, explain, provide a background for or teach methodology or techniques employed herein.

What is claimed is:

1. An acoustic transducer comprising:
   a plurality of acoustic posts each comprising a transducer stack of alternating acoustic elements and acoustic dampening elements; and
   a low acoustic impedance matrix surrounding the plurality of posts,
   each acoustic post being electrically coupled for multi-pulse time delay operation in the thickness (Z) direction.

2. The acoustic transducer of claim 1, wherein each acoustic element of each transducer stack comprises a lead metaniobate.

3. The acoustic transducer of claim 2, wherein each acoustic element of each transducer stack comprises a piezoelectric element.

4. The acoustic transducer of claim 2, wherein the multi-pulse time delay operation of each acoustic post is configured to provide control of the phase of acoustic signals from each acoustic element of each transducer stack.

5. The acoustic transducer of claim 2, wherein the multi-pulse time d operation of each acoustic post is configured to provide control of an acous c output signal of each acoustic post by phase delay operation of each acoustic element of each transducer stack.

* * * * *